United States Patent

Gove et al.

[15] 3,660,838

[45] May 2, 1972

[54] MULTIPLE POINT SWITCHING APPARATUS

[72] Inventors: Donald C. Gove, Manchester; Barry W. Mullins; Edmund G. Rousseau, both of Chelmsford, all of Mass.

[73] Assignee: Control Devices Inc., Woburn, Mass.

[22] Filed: Apr. 2, 1970

[21] Appl. No.: 25,088

[52] U.S. Cl. ....................340/365, 317/256, 323/93

[51] Int. Cl. ....................G08c 9/02

[58] Field of Search ....................340/365, 365 C

[56] References Cited

UNITED STATES PATENTS 3,293,640 12/1966 Chalfin ....................340/365

OTHER PUBLICATIONS

IBM Technical Disclosure Bulletin, Vol. 3, No. 11, April 1961, page 31

*Primary Examiner*—Thomas B. Habecker
*Attorney*—Stephen B. Judlowe

[57] ABSTRACT

A multiple point switching array employs a plurality of keys for effecting a variable capacitance coupling between an oscillator and oscillation-responsive semiconductor switching circuits. The output of the semiconductor switches are encoded onto a plurality of sense buses, and connected therefrom to output digit lines via a plurality of sense amplifiers.

A strobe circuit is provided to simultaneously enable the sense amplifiers after their switching thresholds have been exceeded, and circuitry is employed to inhibit all outputs when more than one key is actuated at any one time.

11 Claims, 3 Drawing Figures

Figure 1A:
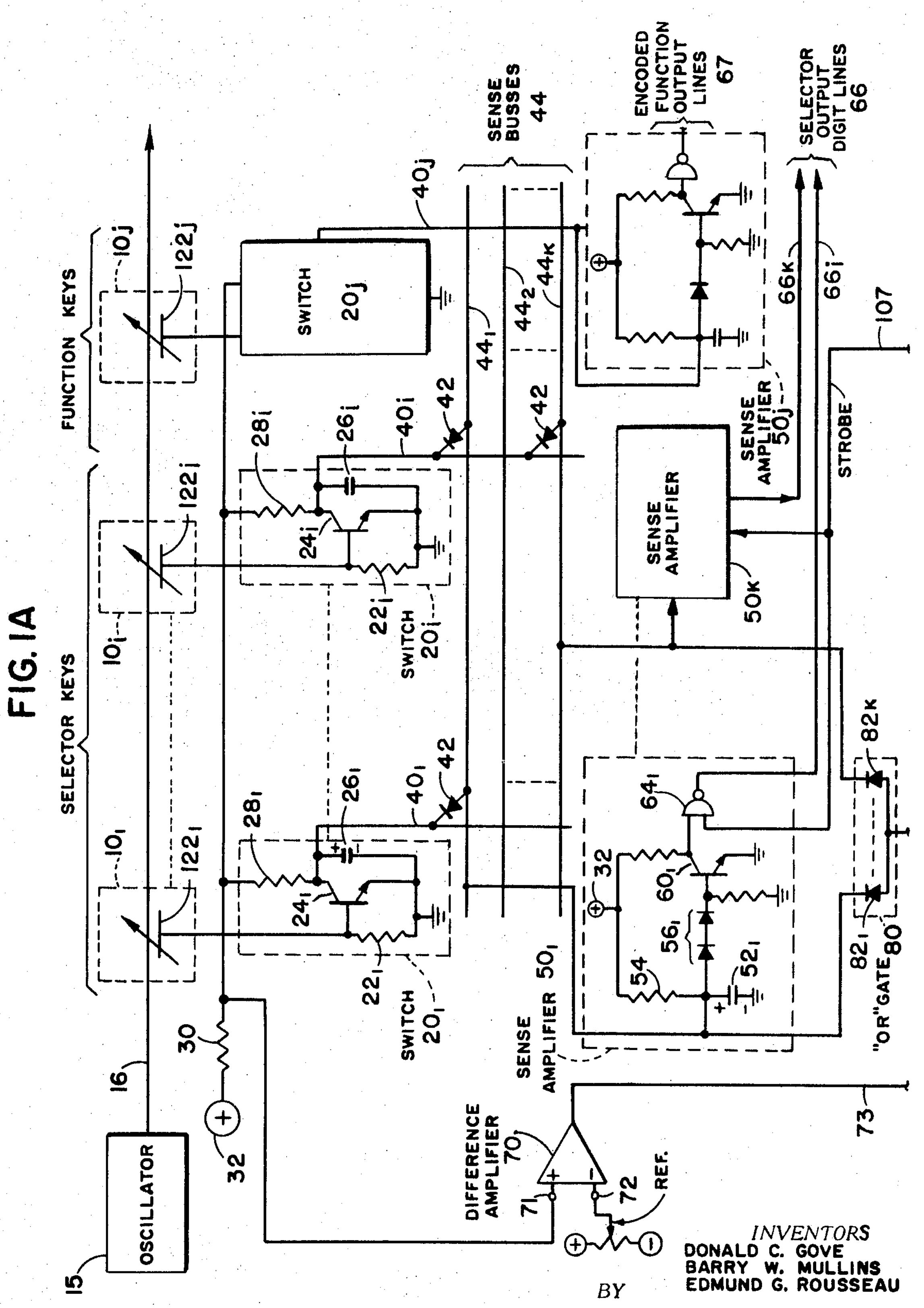

INVENTORS
DONALD C. GOVE
BARRY W. MULLINS
EDMUND G. ROUSSEAU
BY
Davis, Hoxie, Faithfull & Hapgood
ATTORNEYS INVENTORS
DONALD C. GOVE
BARRY W. MULLINS
EDMUND G. ROUSSEAU
BY
Davis, Hoxie, Faithfull & Hapgood
ATTORNEYS

MULTIPLE POINT SWITCHING APPARATUS

This invention relates to electronic switching apparatus and, more specifically, to a selector switch arrangement employing an array of noncontacting switching points each giving rise to a corresponding characteristic output signal encoding pattern when actuated.

An array of switching points are often included on a process control console, alpha-numeric keyboard or the like to enter digital signals in an electronic system for varying purposes. In the most fundamental of these arrangements, manual switch closures may directly effect corresponding system functions, as by changing potential on an associated dedicated line, or energizing a relay. Alternatively, the input key switches may be utilized to enter data in encoded format into a system. Moreover, combinations of data and function (control) key switches have heretofore been utilized.

Many prior art selector keyboard switching structures have employed mechanical switching contacts to effect direct electrical data and/or control connections. However, system errors develop by reason of contact bounce, or when the contact impedance rises, e.g., by reason of dirty, heavily oxidized or pitted contact points. Further, errors develop in prior art keyboard arrangements when multiple keys are depressed.

Semiconductor switching elements have been employed in existing selector-keyboard switching arrangements. The semiconductors have often been selectively gated conductive by mechanical switching contacts, and thus suffer the disadvantages discussed above relating to selectively physically engaged contacts, as well as the multiple key depression difficulty. Further, where special semiconductor devices such as Hall effect elements have been utilized, the keyboard is subject to transient-responsive error signals and, in fact, semiconductor destruction by reason of pronounced electrical transients. Further, prior art semiconductor configurations have been relatively expensive.

It is thus an object of the present invention to provide improved switching apparatus.

More specifically, an object of the present invention is the provision of an improved multiple switching point keyboard arrangement which is reliably operable with noncritical, wide margins; which may be relatively simply and inexpensively fabricated; and which does not employ physically engaging contacts.

The above and other objects of the present invention are realized in an illustrative switching arrangement employing an array of manually operated keys disposed on a control console, keyboard or the like each having a transistor switch arrangement associated therewith. When any key is depressed, the output of an oscillator is coupled by a relatively large capacitance effected by the depressed key to switch the state of the transistor switch associated therewith. The key construction provides the requisite relatively large sinusoidal input to the switch when depressed, and almost complete isolation between these members when not actuated, this being effected without physically engaging contacts.

The output states of the several transistor switches are encoded onto a plurality of sense buses which are connected to a plurality of sense amplifiers. An OR logic gate connects the sense buses to a strobe circuit which exhibits a switching threshold requiring a greater signal change for switching vis-a-vis the thresholds of the sense amplifiers. The strobe circuit thus operates to coincidentally enable the sense amplifiers such that all output data is developed concurrently.

Circuitry is provided to disable the strobe circuit, and thereby also the sense amplifiers, if more than one key is depressed at any time.

Figure 1B:
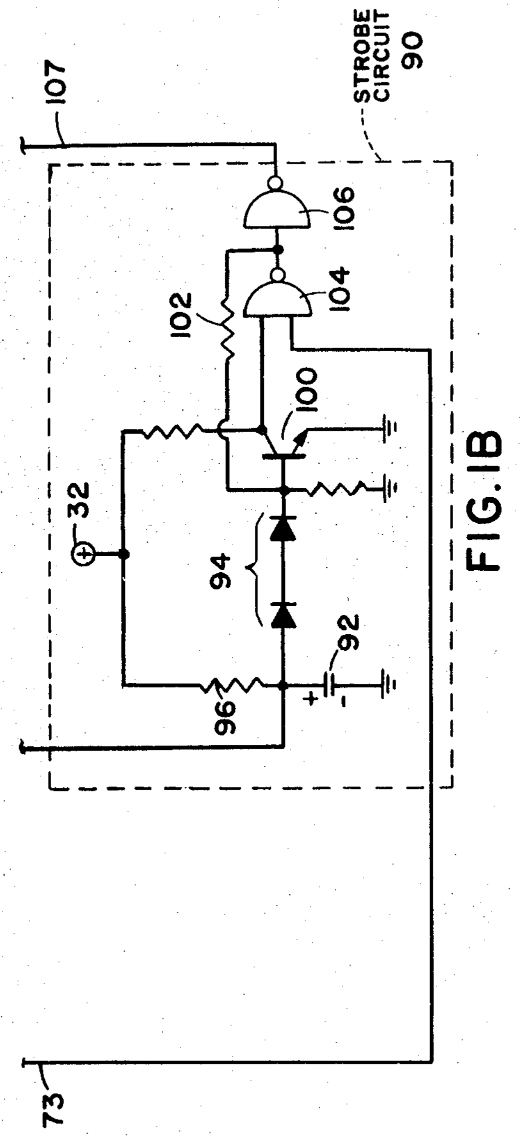
Figure 2:
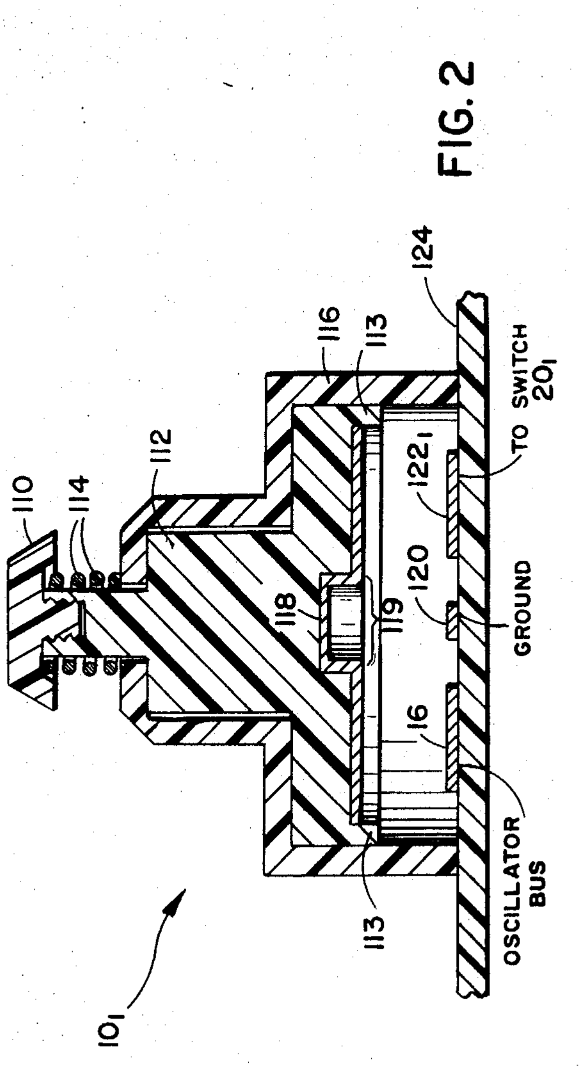

The above and other objects and features of the present invention are realized in a specific, illustrative embodiment thereof, described in detail hereinbelow in conjunction with the accompanying drawing, in which:

FIGS. 1A and 1B respectively comprise the top and bottom portions of a schematic diagram depicting a multiple switch keyboard arrangement embodying the principles of the present invention; and FIG. 2 comprises a cross-sectional view of a variable capacitance key structure for the arrangement of FIG. 1.

Referring now to FIGS. 1A and 1B, hereinafter referred to as composite FIG. 1, there is shown a multipoint switching apparatus, as for a keyboard, process control or data console, or the like. The arrangement in the general case includes a plurality of selector key switches $10_1$ –$10_i$ each of which is associated with a different input variable, e.g., a different alphanumeric character for the keyboard situation. There is also included one or more function keys $10_j$ each of which gives rise to an associated output operation, or function, when depressed. For a typewriter application, the function keys may cause a margin return, case shift, or the like. In a process environment, each function key may open a valve, effect a data connection by way of a dependent relay, or generate any other operational condition or sequence.

Each of the keys 10 selectively varies the capacitive coupling between a common bus line 16 connected to an oscillator 15, and a particular second operative capacitor conducting plate 122 associated therewith and connected to a corresponding oscillation-responsive switch 20. A very low capacitance obtains between the bus 16 and each of the plates 122 when the keys 10 are in their quiescent, raised positions. Correspondingly, when any key $10_n$ is depressed, the effective capacitance between the bus 16 and the particular conductor segment $122_n$ associated with the actuated key is greatly increased.

An illustrative key switch 10, viz., the key $10_1$, is shown in detail in FIG. 2 in cross-sectional form. The key comprises inner and outer members 112 and 116, for example formed of a plastic material, the inner member 112 being adapted to vertically slide within the outer member 116. The inner member is biased vertically upward in FIG. 2 by action of a compression spring 114 acting between the top of the outer member 116 and a cap 110 mounted on a projecting portion of the inner member 112. The composite switch $10_1$ may be secured on a printed circuit board 124 having the common bus 16 and independent isolated conducting segments 122 disposed thereon along parallel rows. A grounded conductor 120 is advantageously disposed between the conductors 16 and 122. Further, a conducting surface 118 is secured on the bottom of the inner key member 112, and the inner member 112 includes projections 113 on the bottom peripheral portion thereof.

With the key in its raised position as shown in the drawing, there is an extremely small effective capacitance between the conductors 16 and $122_1$. This results from the large direct spacing between the elements 16 and $112_1$; the interconductor $16–122_1$ shielding, or signal shunting, effected by the grounded conductor 120; and the long air gap in the coupling path from the conductor 116 through the relatively large distance up to the raised conductor 118 and then down through this distance to the conductor $112_1$.

When the key $10_1$ is depressed, the conducting surface 118 approaches very close to the conductors 16 and 122, the minimum spacing therebetween being determined and maintained by the inner switch member projections 133 abutting against the top of the printed circuit board 124. This spatial relationship gives rise to a high capacitance, relatively low impedance (at the oscillator frequency) signal coupling path from the conductor 16 to the conductor 118 spaced in proximate relation thereto and from the conductor 118 to the switch $20_1$ via the conductor $122_1$. Alternatively, the physically noncontacting insulation between the conductor 118 and the elements 16 and 122 may be assumed by providing an insulating layer or coating between these members, for example, by utilizing an insulating tape.

A notched or indented area 119 is advantageously disposed in the bottom of the inner key member 112 and in the form of the conductor 118 such that the conductor 118 is not spaced close to the grounded conductor 120 when the key is depressed. Accordingly, when the key is so depressed, the signal path between the sinusoidal signal bus 16 and the switch driving conductor 122 is not shunted by a high capacitance between the element 118 and ground.

In summary then, a key switch $10_n$ provides a very low capacitance, high impedance coupling between the oscillator 15 and the corresponding switch $20_n$ when the key $10_n$ is in its raised, normal position under the action of the compression spring 114, and there is a relatively high capacitance, low impedance path between these circuit elements $15$–$20_n$ when the key $10_n$ is depressed.

Returning again to composite FIG. 1, the oscillator 15 provides a relatively high frequency oscillation, e.g., on the order of 100 khz to the bus 16 at reasonably high levels, e.g., several hundreds of volts. The effective capacitor terminal plates $122_n$ are each connected to a different switch $20_n$ each of which includes a transistor 24 connected in a grounded emitter configuration with a collector resistor 28, and a capacitor 26 connected between the transistor collector and ground. Further a resistor 22 connects the base of the transistor 24 to ground.

Again examining the switch $20_1$ and key $10_1$ as illustrative of the other such elements, the transistor $24_1$ is normally nonconductive since it does not receive a forward base drive. In particular, the very low effective quiescent capacitance between the bus 16 and the conductor segment $122_1$ when the key $10_1$ is not actuated couples only a very minute, deminimous sinusoidal potential to the switch $20_1$, this base energization for the device $24_1$ being insufficient to initiate significant conduction therethrough. Accordingly, the capacitor $26_1$ charges in the polarity shown to approximately the full voltage value of a source 32 through a path comprising a common resistor 30 and the collector resistor $28_1$.

When the switch $10_1$ is depressed, a considerable sinusoidal voltage, typically on the order of several volts, is passed by the relatively high capacitance of the key $10_1$ to the base of the transistor $24_1$, gating the transistor on during the positive sinusoidal (or other waveform) half cycles. Because the oscillation frequency is relatively high, and the "on" conduction impedance of the transistor $24_1$ is very much lower than the impedance of the collector resistor $28_1$, the capacitor $26_1$ rapidly discharges from the initially stored full voltage of the source 32 toward the saturation potential of the transistor $24_1$ through the collector-emitter conduction path of the transistor. Accordingly, the voltage on a switch $20_1$ output line $40_1$ quickly falls to approach ground. The signal changes occur in a very small percentage of the time it takes for the most rapid physical actuation of a key. Correspondingly, a high to low voltage transition is produced on each of the output lines 40 associated with the otherkeys 10 and switches 20 when the corresponding key is depressed.

When the key $10_1$ is released, the sinusoidal forward drive is removed from the transistor $24_1$ which thus returns to its quiescent nonconductive state. Accordingly, the capacitor $26_1$ again charges towards the value of the potential source 32.

The output signals on the several switch 20 output lines $40_n$ are encoded onto a plurality of sense buses 44 by a plurality of matrix crosspoint diodes 42 selectively connected therebetween. That is, each of the output conductors 40 associated with the selector keys $10_1$ $-10_i$ is connected to a unique and mutually differing array of the sense buses 44 via one or more diodes 42. For example, the conductor $40_1$ is shown as having only one connection, that being to the sense bus $44_1$, while the conductor $40_i$ associated with the key $10_i$ is shown as connected to the first and last buses $44_1$ and $44_k$.

When any key $10_i$ is actuated, the diodes 42 having their cathodes connected to the output lead $40_i$ associated with the depressed key will clamp a corresponding sense bus or buses 44 associated therewith to the approximate ground going potential given by the saturation potential of the associated transistor $24_i$ and the few tenths of a volt drop across the diodes 42. The remaining conductors 44 having no diode connecting them to the actuated output conductor $40_i$ will not have a ground restraint thereon. This pattern of ground and nonground signals on the buses 44 comprises an encoding which suffices when steady state is reached to identify the actuated key.

However, in accordance with other aspects of the present invention, it is further desirable from a reliability and error avoidance standpoint to further process the array of signals on the sense buses 44. For example, the situation often arises where two keys 10 are inadvertently depressed at once, either by an operator's finger hitting two adjacent keys, or by striking a second key before the first key is released. Where two or more keys are depressed, the diodes 42 in essence effect a logical OR operation vis-a-vis the conductors 40 and 44 such that ground signals will appear on the buses 44 wherever a diode connects a bus to the output 40 associated with any depressed key. Thus, this mixed hybrid ground pattern may generate prohibited encoding states, or may give rise to simple errors.

Further, by reason of differing characteristic voltages for the diodes 42 and the varying sensitivities of each digit receiving channel for the end use equipment, the ground going voltage signals on the buses 44 will in general be interpreted by the output equipment as changing state at differing times, thus generating a sequence of digital words until the data settles to steady state.

Accordingly, there is employed a plurality of sense amplifiers $50_1$ $-50_k$ associated with each of the sense buses 44, and a sense amplifier $50_j$ associated with each of the function keys $10_j$. Moreover, there is included structure described hereinbelow for disabling the sense amplifiers $50_1$ $-50_k$ when more than one key has been depressed.

Each sense amplifier $50_1$ $-50_k$ is supplied as an input with the voltage on a corresponding one of the sense buses $44_1$ $-44_k$. Examining the sense amplifier $50_1$, illustrative of the array, there is included a grounded emitter transistor $60_1$ which is normally held conductive through a base energizing path comprising a voltage source (e.g., the source 32), a resistor $54_1$, and two voltage reducing diodes 56. Accordingly, the voltage at the collector of the transistor $60_1$ is normally low, thereby maintaining the output of a NAND-gate $64_1$ and an output digit line $66_1$ connected thereto normally high. The signal states of the array of output digit lines 66 comprise the encoded output information which identifies which one, if any, of the keys $10_1$ $-10_i$ has been actuated. Further, a capacitor $52_1$ is connected across the input of the sense amplifier $50_1$ and is normally charged in the polarity shown in the drawing with a potential essentially given by that across the diodes $56_1$ and the forward base-emitter drop of the transistor $60_1$.

When any key having a diode 42 connection to the bus $44_1$ is operated, e.g., the keys $10_1$ or $10_i$ in FIG. 1, the ground going potential on the bus $44_1$ is coupled to the input of the sense amplifier $50_1$. Accordingly, the charge capacitor $52_1$ discharges towards ground through one of the diodes 42 and the saturated transistor 24 of the switch 20 associated with the actuated key. Accordingly, as the capacitor 52 approaches ground potential, base drive is removed from the transistor 60 and the collector voltage of the transistor $60_1$, forming one input to the NAND-gate $64_1$, goes high.

Correspondingly also, the transistor 60 collector potential in the sense amplifier(s) 50 associated with any other sense buses 44 having a ground going potential supplied thereto similarly becomes positive. However, these collectors become positive at different times since the sense amplifiers 50 have differing state-changing input voltage thresholds.

A strobe circuit 90 normally supplies a relatively low potential to a second input of the NAND gate 64 in each of the sense amplifiers 50 via a lead 107 thus retaining the output of the NAND-gates 64 and the potential state of the lines 66 at a high, or positive potential irrespective of the voltage supplied to the other NAND input from the several transistors 60. Thus, for example, when the key $10_1$ is depressed, the output of the NAND-gate $64_1$ initially remains high even though the voltage at the collector of the transistor $60_1$ became positive as part of the internal functioning of the amplifier $50_1$. As described below, the strobe circuit 90 supplies an amplifier 50 enabling positive voltage to the lead 107 after all the amplifiers 50 have responded to the input signals coupled thereto such that the digit lines 66 will simultaneously change from an all high condition to their information states.

To this end, the input voltages from the sense buses $44_1$ $-44_k$ are supplied to a corresponding input of a diode OR gate 80 in addition to being supplied to one of the sense amplifiers $50_1$ $-50_k$. Accordingly, when the switch $10_1$ is depressed, the ground going potential on the sense bus $44_1$ is supplied via a diode $82_1$ to the input of the strobe circuit 90.

The strobe circuit 90 comprise a normally conductive transistor 100 which is held conductive by a conduction path from the voltage source 32 through a resistor 96 and two diodes 94. As discussed above with respect to the similar structure of the sense amplifiers 50, a capacitor 92 initially stores a voltage corresponding to the forward potential drops of the diodes 94 and the input junction of the transistors 100. The transistor is normally further forward biased to a limited extent by a current path from the normally high output of a NAND-gate 104 through a resistor 102.

When the ground potential is applied to the strobe circuit 90 via the OR-gate diode $82_1$, the capacitor 92 discharges and forward bias is removed from the transistor 100 rendering it nonconductive, the current through the resistor 102 being insufficient to sustain conduction. Accordingly, the collector potential of the transistor 100 goes positive hence constraining the output of the normally partially enabled NAND-gate 104 to attain ground potential. This negative going potential is coupled to the base of the transistor 100 by the feedback resistor 102 to form a regenerative turn off rate accelerating effect.

The strobe circuit 90 is characterized by a lower state-switching input voltage threshold than that of any of the sense amplifiers 50. That is, the voltage on any of the sense buses 44 must fall to a lower potential to switch the output state of the strobe circuit 90 than to switch any of the sense amplifiers 50. This result obtains since a portion of the input signal voltage change employed to switch the sense amplifiers 50 is dropped across the OR gate diodes 82 before being applied to the strobe circuit 90; and also because the resistor 102 provides some forward bias for the transistor $100_1$ not employed in the switching sense amplifiers 50, which must be overcome before the strobe circuit 90 will change state. Thus, the digital information uniquely identifying an actuated key 10 is available at the collectors of the sense amplifier transistors 60 before the output of the strobe circuit 90 can change state.

After the output of the OR gate 80 falls below the switching threshold for the strobe circuit 90, the transistor 100 becomes nonconductive as above stated, switching the output of the NAND-gate 104 to a low state assuming a proper output of the difference amplifier 70 is discussed below. The output of the NAND-gate 104 is again inverted to a high voltage state by an inverter 106 to unblock, i.e., partially enable, the NAND-gates 64 in the sense amplifiers $50_1$ $-50_l$. Accordingly, the low, near ground digital voltage (defined as a binary "1" output potential) will obtain on the digit lines 66 associated with a grounded sense bus 44, while a relatively high voltage (a binary "0") will persist on the remaining lines. This digital information will simultaneously appear on the lines $66_1$ $-66_k$ as a transition from the initial 00..0 state. This information may then be employed for any end use purpose.

In accordance with a further aspect of this invention, the strobe circuit 90, and thereby also the sense amplifiers 50, are disabled when more than one key 10 is depressed at any one time. To this end, the collector of each of the transistors 24 in the oscillation-responsive switches 20 are connected to the positive supply 32 via the common resistor 30. The potential at one resistor 30 terminal is applied to the noninverting input terminal 71 of the difference amplifier 70. A preselected reference potential is applied to the inverting difference amplifier input 72.

When no key, or only a single key 10 is depressed, the voltage drop across the common resistor 30 is such that the potential at the noninverting difference amplifier terminal 71 exceeds that at the inverting terminal 72. Accordingly, the output of the difference amplifier 70 is positive and the NAND-gate 104 is partially enabled to process key identification data as it is encountered in the manner considered above.

However, if more than one key is depressed, the current flow through the resistor 30, comprising the sum of the current through the two or more conducting transistors 24, lowers the potential at the difference amplifier input 71 below that obtaining at the noninverting input 72. Accordingly, the output of the difference amplifier 70 goes negative thereby maintaining the NAND-gate 104 in its positive output voltage state, hence also supplying ground potential at one input of the amplifier 50 NAND-gates 64 by way of the inverting gate 106. This, in turn, maintains the output of the NAND-gates 64 in their high potential state such that no data can appear on the output digit lines 66 notwithstanding that two or more keys have been depressed.

When the keys are released such that not more than one key remains actuated, the output of the difference amplifier 70 returns to its normally positive state to again permit processing of data.

As a final system function, the function key or keys $10_j$ are typically not encoded onto the digit lines $66_i$, and thus the output conductor(s) $40_j$ are connected to the sense amplifier $50_j$, either directly or via a dedicated sense bus without any requirement for a diode 42.

Since the output of the function sense amplifier $50_j$ is not involved in the encoding process, it is not necessary that an output from the sense amplifier $50_j$ be delayed until corresponding outputs from any other amplifiers 50 are available. Accordingly, the sense amplifier $50_j$ operates in a manner analogous to the selector key associated sense amplifiers $50_1$ through $50_k$ to selectively provide a low output signal at a function output line 67 when the key $10_j$ is actuated, except that only one voltage shifting diode need be employed, and no connection to the strobe signal is required.

Thus, the composite arrangement of FIG. 1 has been shown by the above to reliably provide an encoding on a plurality of output digit lines 66 when any single selector key $10_1 \ldots 10_i$ is depressed; to supply an output signal at one or more function output lines 67 when a function key $10_j$ is actuated; and to suppress data on the digit lines 66 when multiple keys have erroneously been depressed.

The above-described multiple switch embodiment is merely illustrative of the principles of the present invention. Numerous modifications and adaptations thereof will be readily apparent to those skilled in the art without departing from the spirit and scope of the present invention. For example, each switch 20 may include a plurality of output conductors which are employed when energized to interrogate a read only memory. The output signal encoding generated by activating a particular key would then correspond to the information pattern stored in the read only memory.

What is claimed is:

1. In combination in switching apparatus, first and second spaced and insulated conductors, a grounded conductor disposed intermediate said first and second conductors, a key including a key conductor having a first portion movable into proximity with said first conductor and a second portion movable into proximity with said second conductor, means for biasing said key to a quiescent condition, means for moving said key conductor, means inhibiting physical contact between said key conductor with either of said first and second conductors, an oscillator connected to said first conductor for supplying output oscillations thereto, and oscillation-responsive switch means connected to said second conductor.

2. A combination as in claim 1 wherein said key conductor includes an indented shaped portion for maintaining a relatively large spacing from said grounded conductor.

3. A combination as in claim 1 wherein said oscillation-responsive switch means comprises a transistor connected in a grounded emitter configuration, a capacitor connected in parallel with the collector emitter of said transistor, and means connecting the base of said transistor with said second conductor.

4. A combination as in claim 3, further comprising an additional plurality of biased keys and oscillation-responsive switch means, said second conductor including a plurality of insulated segments each associated with a different one of said keys and switch means, a diode encoding matrix including input and output conductors, said switch means being coupled to said matrix input conductors, and a plurality of sense amplifiers each connected to a different one of said matrix output connectors, each of said sense amplifiers including threshold means for constraining said amplifier to reside in first and second characteristic states when the input voltage applied thereto is disposed above and below said input voltage threshold.

5. A combination as in claim 4, further comprising a strobe circuit, OR logic means connecting the input of each of said sense amplifiers with the input of said strobe circuit, said strobe circuit having a threshold such that said strobe circuit resides in a first and second output state when the input voltage applied thereto is disposed above and below said threshold level, said threshold for said strobe circuit requiring a greater signal change for switching than said threshold of said sense amplifiers, said strobe circuit including output means for selectively enabling said sense amplifiers.

6. A combination as in claim 5 further comprising means for sensing the cumulative current flow through said switch means, and means responsive to said current sensing means supplying an indication that more than one of said switch means is conducting at any time for disabling said sense amplifiers.

7. A combination as in claim 6 wherein said sense amplifier disabling means comprises a difference amplifier for selectively disabling said strobe circuit.

8. A combination as in claim 1 further comprising an additional plurality of said keys and said switch means, said second conductor including a plurality of insulated segments each associated with a different key and switch means, output line means selectively having signals representative of the conduction states of said switch means impressed thereon, and means for disabling said switch means when more than one of said keys are coincidentally depressed.

9. In combination in switching apparatus, an oscillator, plural switch means, a plurality of key means selectively operable to effect a relatively high capacitance coupling path from said oscillator to an associated one of said switch means, each of said switch means including a transistor in a grounded emitter configuration and a capacitor connected in parallel with the collector-emitter of said transistor, a diode encoding matrix having input and output conductors, means coupling said switch means to said matrix input conductors, plural sense amplifier means each exhibiting an input switching threshold and having their inputs connnected to a different one of said matrix output conductors, an OR logic gate having an output and plural inputs each connected to a different one of said matrix output conductors, strobe circuit means having an input connected to the output of said OR gate and an output for selectively enabling said sense amplifier means, said sense amplifier means being controlled by said strobe circuit means, said strobe circuit having a threshold which requires a greater signal change for enabling said sense amplifier means than the switching thresholds for said sense amplifier means.

10. A combination as in claim 9 further comprising means for disabling said sense amplifier means when more than one of said switch means is conducting.

11. A combination as in claim 10 wherein said sense amplifier disabling means includes means for sensing the current flow through such switch means, and a difference amplifier connected to said current sensing means for selectively disabling said strobe circuit.

* * * * *